United States Patent [19]
Aoki et al.

[11] Patent Number: 5,636,127
[45] Date of Patent: Jun. 3, 1997

[54] METHOD AND APPARATUS FOR CARRYING AND LOCATING SHEET FRAME

[75] Inventors: Hideji Aoki; Hidetaka Yamasaki; Kazuhisa Hiroshige, all of Fukuoka, Japan

[73] Assignee: Mitsubishi Denki Kabushiki Kaisha, Tokyo, Japan

[21] Appl. No.: 607,355

[22] Filed: Feb. 26, 1996

Related U.S. Application Data

[62] Division of Ser. No. 44,501, Apr. 9, 1993, Pat. No. 5,520,276.

[30] Foreign Application Priority Data

May 7, 1992 [JP] Japan ..................... 4-114704

[51] Int. Cl.$^6$ ..................... G06F 19/00; B65G 35/00
[52] U.S. Cl. ..................... 364/474.09; 198/345.1; 198/836.3; 414/749
[58] Field of Search ................ 364/474.09, 469, 364/478; 198/345.1, 735.3, 836.3; 414/749, 226, 753, 224; 29/759

[56] References Cited

U.S. PATENT DOCUMENTS

| | | | |
|---|---|---|---|
| 4,791,715 | 12/1988 | Lovelace | 414/224 |
| 4,880,104 | 11/1989 | Evans et al. | 198/836.3 |
| 4,898,268 | 2/1990 | Kamioka et al. | 29/759 |
| 4,958,722 | 9/1990 | Kobayashi et al. | 198/735.3 |
| 5,353,910 | 10/1994 | Harris et al. | 198/345.1 |
| 5,520,276 | 5/1996 | Aoki et al. | 198/345.1 |

*Primary Examiner*—Paul P. Gordon
*Assistant Examiner*—Thomas E. Brown
*Attorney, Agent, or Firm*—Oblon, Spivak, McClelland, Maier & Neustadt, P.C.

[57] ABSTRACT

In order to efficiently carry and locate a plurality of types of sheet frames having different dimensions, it is possible to change and adjust positions of lower guide rails in response to a width of a supplied lead frame in a shorter-side direction (X). A carrier device and a stop device can adjust and change a carriage distance in a carriage direction and a stop position in response to a longitudinal width of the lead frame respectively. Thus, it is possible to carry and locate sheet frames in response to various dimensions thereof.

4 Claims, 14 Drawing Sheets

METHOD AND APPARATUS FOR CARRYING AND LOCATING SHEET FRAME

This is a division of application Ser. No. 08/044,501 filed on Apr. 9, 1993 now U.S. Pat. No. 5,520,276.

BACKGROUND OF THE INVENTION

1. Field of the Invention

The present invention relates to a technique of carrying and locating a sheet frame, which is employed for transferring a lead frame having a resin-molded semiconductor device from a step to another step in steps of fabricating a semiconductor device, for example.

2. Description of the Background Art

<Structure of the Prior Art>

Steps of fabricating a semiconductor device include a step of molding a semiconductor chip which is mounted on a lead frame with resin and a step of molding a subsequent lead frame. Between these two steps, it is necessary to carry the preceding lead frame from the former step to the latter step while locating the same at a prescribed position. FIGS. 13 and 14 are a plan view and a front elevational view showing a sheet frame employed for such a purpose.

Referring to these figures, a lead frame 1 having a prescribed width and a prescribed length is mounted on a lower rail 21 which is provided on a sheet frame carrying-and-locating apparatus 2. A completely resin-molded semiconductor device 1a is integrated in the lead frame 1. Guide bars 21a are fixedly mounted on the lower rail 21, while a pair of upper rails 22a and 22b are slidably supported by the guide bars 21a to be movable along a horizontal shorter-side direction X of the lead frame 1. A pair of fixed upper rails 23a and 23b are provided on the lower rail 21 adjacently to the upper rails 22a and 22b. Guide spaces 24, which are clearances for guiding the lead frame 1, are defined between the pair of upper rails 22a and 22b, being most approached to each other in closed states, and the lower rail 21. Similar guide spaces 24 are also defined between the pair of fixed upper rails 23a and 23b and the lower rail 21.

The apparatus 2 is provided with a pair of drive units 25, which are adapted to drive the pair of upper rails 22a and 22b in the shorter-side direction X respectively to bring the same into separated (open) states or closed states at need. The apparatus 2 further comprises a carrier 26 for carrying the lead frame 1, whose end portions are stored in the guide spaces 24, in a horizontal carriage direction Y, shown by arrow in FIG. 13, longitudinally along the lead frame 1 with a prescribed distance, a drive unit 27 for driving the carrier device 26, a stopper 28 for stopping the as-carried lead frame 1 at a prescribed position, and a drive unit 29 for upwardly and downwardly driving the stopper 28.

<Operation of the Prior Art>

The conventional apparatus 2 operates as follows: First, the drive units 25 so operate that the pair of upper rails 22a and 22b are guided by the guide bars 21a to slide in directions to be separated from each other (open directions), to enter open states. Then, the lead frame 1 is placed on the lower rail 21 by action of a supplier (not shown) from above the lower rail 21. Thereafter the upper rails 22a and 22b slide toward each other along the shorter-side direction X, to enter closed states. At this time, the upper rails 22a and 22b define the guide spaces 24 with the lower rail 21, to hold cross-directional end portions of the lead frame 1 therein.

Then, the lead frame 1 is carried by the carrier 26, which is driven by the drive unit 27, along the carriage direction Y with a prescribed distance. The lead frame 1 is stopped at a prescribed position by the stopper 28 which is located on an upper direction. At this time, cross-directional end portions of the lead frame 1 are held in the other guide spaces 24 defined by the fixed upper rails 23a and 23b and the lower rail 21 so that the position of the lead frame 1 is settled in the shorter-side direction X, while the same is stopped by the stopper 28 so that its position is settled in the longitudinal direction. The lead frame 1 thus located in a prescribed position is then held by a transfer device (not shown) and the stopper 28 is downwardly driven by the drive unit 29, to release the lead frame 1 from the stopped state. After the lead frame 1 is transferred to a next fabrication step by the aforementioned transfer device, the stopper 28 is upwardly moved to the original upper direction, while the carrier 26 also returns to its original position. The aforementioned steps are so repeated as to carry and locate a plurality of lead frames.

<Problems of the Prior Art>

In the conventional apparatus 2, the lower rail 21 is fixed at a constant position, and the stopper 28 is moved along the carriage direction Y by a constant distance. In order to carry and locate lead frames 1 of various dimensions, therefore, it is necessary to prepare such apparatuses in response to the dimensions. In other words, the conventional apparatus 2 is inferior in workability and economy for carriage and location of a plurality of types of lead frames 1. This problem is particularly serious in the field of the so-called multi-item small-quantity production for a number of types of lead frames 1 with small quantities.

In the aforementioned apparatus 2, further, the upper rails 22a and 22b slide along the shorter-side direction X. If the lead frame 1 is so deformed that the end portions along the shorter-side direction X cannot be stored in the guide spaces 24, therefore, the upper rails 22a and 22b interfere with the deformed portion upon sliding toward the closed states, to damage the lead frame 1.

SUMMARY OF THE INVENTION

The present invention is directed to a method of carrying and locating a sheet frame for carrying a sheet frame, being substantially in the form of a flat plate, along a direction of a first axis in a major surface of the sheet frame by a prescribed distance and holding the same at a prescribed position.

According to the present invention, the method of carrying and locating a sheet frame comprises (a) a guiding step of supporting the sheet frame to be slidable along the direction of the first axis, (b) a width adjusting step of adjusting a position for supporting the sheet frame in the step (a) in a direction of a second axis, being perpendicular to the first axis, in the major surface in correspondence to a first width of the sheet frame in the direction of the second axis, (c) a carrying step of carrying the sheet frame in the direction of the first axis by a prescribed distance in correspondence to a second width of the sheet frame in the direction of the first axis, and (d) a stopping step of stopping the sheet frame at a prescribed position in correspondence to the second width.

According to the present invention, the position for slidably supporting the sheet frame can be adjusted while the distance and the position for carrying and stopping the sheet frame can also be adjusted respectively, whereby it is possible to arbitrarily carry and locate sheet frames having various sizes.

Preferably, the guiding step (a) comprises (a-1) a step of guiding a first major surface of the sheet frame at an end portion of the sheet frame being provided along the direction of the second axis or in the vicinity of the end portion in the direction of the first axis, (a-2) a step of guiding a second major surface of the sheet frame at the end portion or in the vicinity of the end portion in the direction of the first axis, and (a-3) a step of guiding an edge surface of the sheet frame at the end portion in the direction of the first axis.

According to the present invention, end portions of the sheet frame or portions close thereto are supported to be guided in carriage. Also when the sheet frame is formed by a lead frame having a resin-molded semiconductor device in the vicinity of its center, for example, it is possible to guide the sheet frame.

Preferably, the step (a-1) comprises (a-1—1) a step of preparing (a-1—1—1) first means for guiding the first major surface of the sheet frame at the end portion or in the vicinity of the end portion in the direction of the first axis, and (a-1—1-2) second means provided adjacently to the first means (a-1—1—1) in the direction of the first axis for guiding the first major surface of the sheet frame at the end portion or in the vicinity of the end portion in the direction of the first axis, (a-1-2) a step of approaching the first means (a-1—1—1)to the first major surface from a substantially opposite direction, (a-1-3) a step of guiding the first major surface of the sheet frame in the direction of the first axis through the first means (a-1—1—1), and (a-1-4) a step of guiding the first major surface of the sheet frame in the direction of the first axis through the second means (a-1—1-2).

According to the present invention, the means for guiding the first major surface is first approached to the major surface from an opposite direction, thereby guiding the first major surface. Even if the sheet frame is so deformed that the same cannot be stored in the guide spaces, therefore, it is possible to carry and locate the sheet frame without damaging the same.

The present invention is also directed to an apparatus for carrying and locating a sheet frame for carrying a sheet frame, being substantially in the form of a flat plate, in a direction of a first axis in a major surface of the sheet frame by a prescribed distance and holding the same at a prescribed position.

According to the present invention, the apparatus for carrying and locating a sheet frame comprises (a) guide means for supporting the sheet frame to be slidable in the direction of the first axis, (b) width adjusting means for adjusting a position for supporting the sheet frame by the means (a) in a direction of a second axis, being perpendicular to the first axis, in the major surface in correspondence to a first width of the sheet frame in the direction of the second axis, (c) carrier means for carrying the sheet frame in the direction of the first axis by a prescribed distance in correspondence to a second width of the sheet frame in the direction of the first axis, and (d) stop means for stopping the sheet frame at a prescribed position in correspondence to the second width.

Accordingly, an object of the present invention is to provide a method and an apparatus for carrying and locating a sheet frame which can carry and locate sheet frames such as lead frames having a plurality of types of dimensions.

A second object of the present invention is to provide a method and an apparatus for carrying and locating a sheet frame which can carry and locate a sheet frame without damaging the same even if the sheet frame is so deformed that the same cannot be stored in guide spaces.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Preferred Embodiment 1>
<Overall Structure of Apparatus 100 and System 800>

Figure 1:
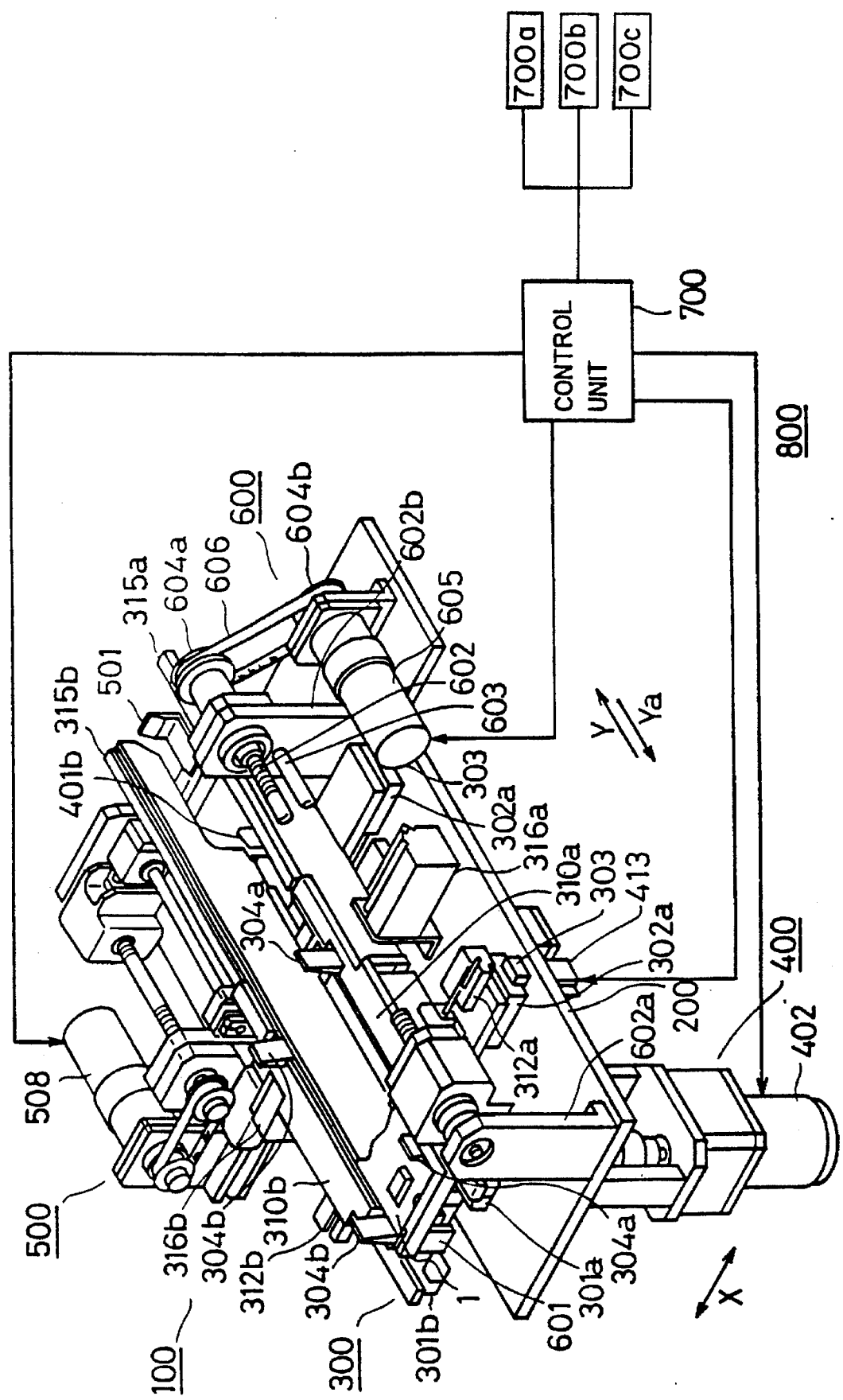
FIG. 1 is a general perspective view showing an apparatus for carrying and locating a sheet frame according to an embodiment of the present invention.

FIG. 1 is a general perspective view showing an apparatus 100 for carrying and locating a sheet frame according to an embodiment of the present invention. This apparatus 100 comprises a base 200, a guide rail (guide means) 300, a width adjusting device (width adjusting means) 400 for adjusting the width of the guide rail 300, a stop device (stop means) 500 for stopping a lead frame 1 at various positions, and a carrier device 600 (carrier means) for carrying the lead frame 1 with various carriage distances. The apparatus 100 serving as a principal part, together with a control unit 700, forms a system 800 for carrying and locating a sheet frame.

<Structure of Guide Rail 300>

Figure 2:
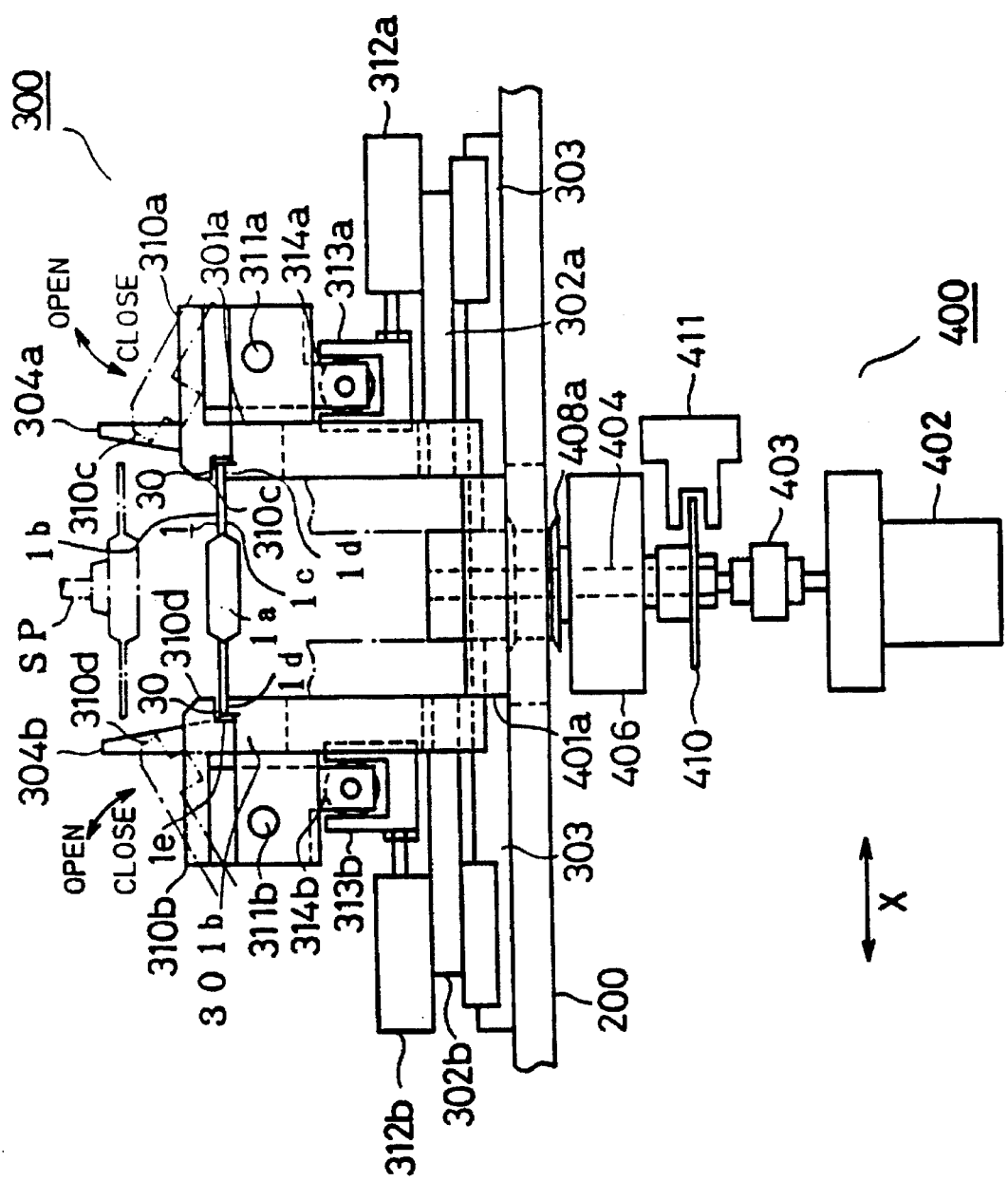
FIG. 2 is a partial front elevational view showing the apparatus for carrying and locating a sheet frame according to the embodiment of the present invention.
Figure 3:
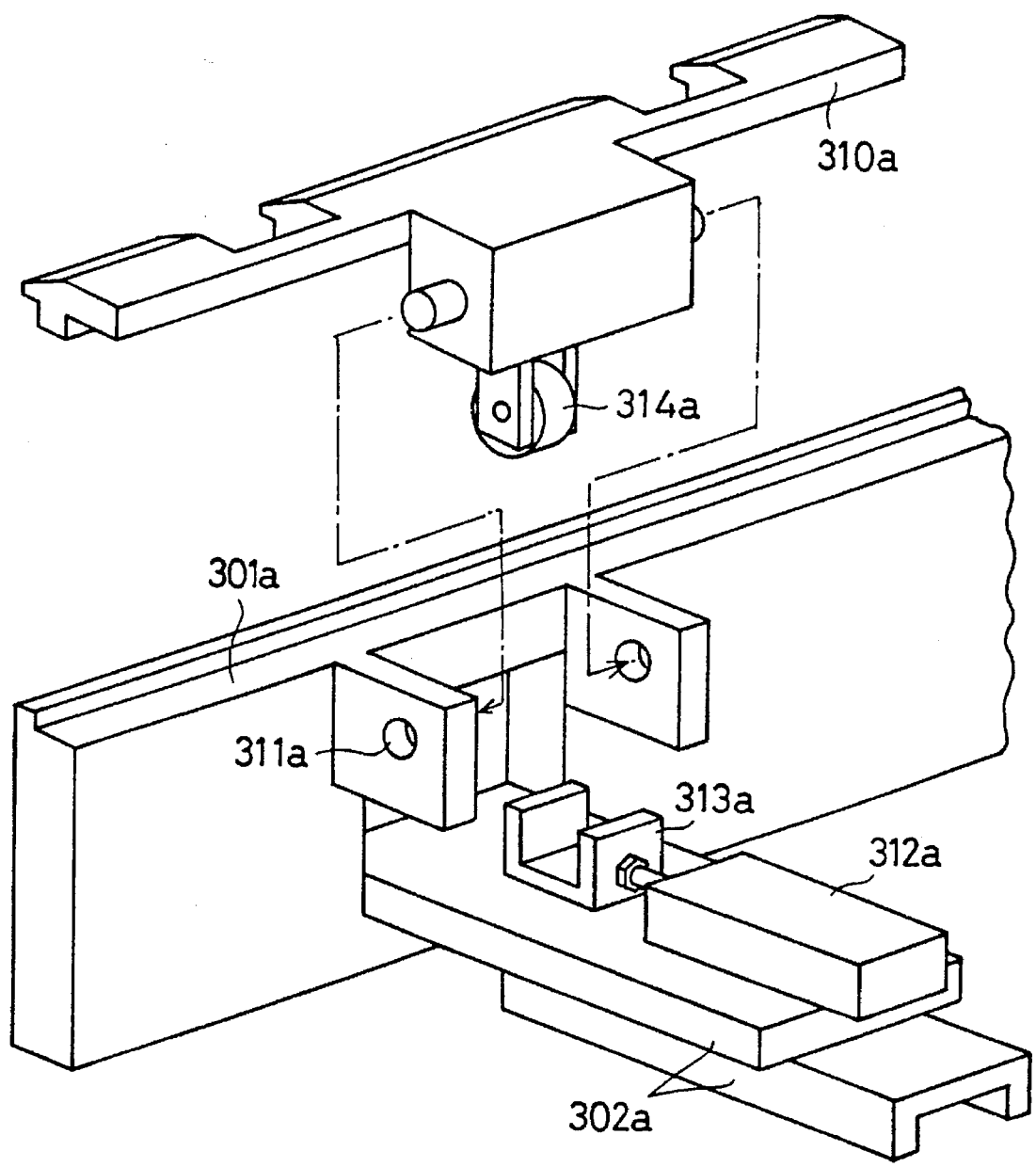
FIG. 3 is an exploded perspective view showing a principal part of a guide rail in the embodiment of the present invention.

FIG. 2 is a partial front elevational view of the apparatus 100, showing the structures of the guide rail 300 and the width adjusting device 400 in particular. FIG. 3 is an exploded perspective view showing a principal part of the guide rail 300. The structure of the guide rail 300 is now described with reference to FIGS. 1 to 3.

The guide rail 300 comprises a pair of lower guide rails 301a and 301b for receiving the lead frame 1, in which a semiconductor device 1a is integrated, and guiding the same. The lead frame 1 is in the form of a substantially rectangular flat plate having a major surface (first major surface) 1b and another major surface (second major surface) 1c. The lower guide rails 301a and 301b slidably guide portions of the major surface 1c in the vicinity of end portions 1d of the lead frame 1 along a shorter-side direction X (direction of a second axis) on upper surfaces thereof. Two pairs of holders 302a and 302b are fixedly coupled to the lower guide rails 301a and 301b respectively. The holders 302a and 302b are supported slidably along the horizontal direction X by a guide rail 303 which is fixed to the upper surface of the base 200. These guide rails 301a and 301b are provided on upper surfaces thereof with two pairs of inclined projections 304a and 304b. Spaces between the pairs of the inclined projections 304a and 304b are broadened toward upper portions. These inclined projections 304a and 304b guide the lead frame 1 to a prescribed position on the lower guide rails 301a and 301b in a process of supplying the same.

The guide rail 300 further comprises a pair of upper guide rails 310a and 310b, which are rotatably supported by the lower guide rails 301a and 301b through rotation supporting points 311a and 311b. A pair of drive units 312a and 312b are fixedly mounted on the upper surfaces of the holders 302a and 302b, to drive transmitters 313a and 313b having grooves in the shorter-side direction X. The grooves of the transmitters 313a and 313b receive rollers 314a and 314b, which are rotatably mounted on portions of the upper guide rails 310a and 310b close to lower ends thereof, with small clearances. When the transmitters 313a and 313b are driven by the drive units 312a and 312b in the shorter-side direction X, the upper guide rails 310a and 310b are rotated about the rotation supporting points 311a and 311b.

When the upper guide rails 310a and 310b enter closed states, i.e., when forward end portions 310c and 310d of the upper guide rails 310a and 310b are most approached to the upper end surfaces of the lower guide rails 301a and 301b, guide spaces 30 are defined between the forward end portions 310c and 310d and the upper end portions of the lower guide rails 301a and 301b. At this time, the upper guide rails 310a and 310b slidably guide edge surfaces 1e at the end portions 1d of the lead frame 1 and portions of the major surface 1b close to the end portions 1d. The guide spaces 30 store the end portions 1d of the lead frame 1 while leaving certain degrees of clearances. Thus, the lead frame 1 is supported at a prescribed position in the shorter-side direction X, while the same is slidable in a carriage direction Y, which is the longitudinal direction (direction of a first axis) of the lead frame 1, along the lower guide rails 301a and 301b and the upper guide rails 310a and 310b.

The upper guide rails 310a and 310b are rotated between open states, in which the forward end portions 310c and 310d are most separated from the lower guide rails 301a and 301b, and the aforementioned closed states.

Figure 4:
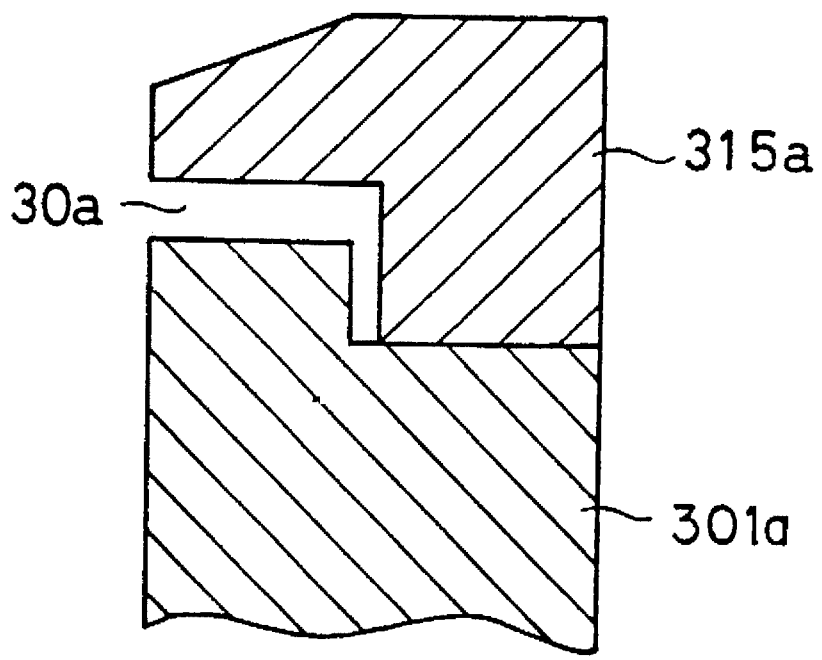
FIG. 4 is a front sectional view showing an upper guide rail and an upper fixed guide rail in the embodiment of the present invention.

The lower guide rails 301a and 301b are provided on the upper surfaces thereof with upper fixed guide rails 315a and 315b (FIG. 1) adjacently to the upper guide rails 310a and 310b. FIG. 4 is a front sectional view showing the lower guide rail 301a and the upper fixed guide rail 315a which is provided on its upper surface. Defined between the upper fixed guide rail 315a and the lower guide rail 301a is a guide space 30a, which is identical in shape to the guide spaces 30 defined between the upper guide rails 310a and 310b and the lower guide rails 301a and 301b. This also applies to the upper fixed guide rail 315b and the lower guide rail 301b. Thus, the lead frame 1, whose end portions 1d are stored in the guide spaces 30, is smoothly moved into the guide spaces 30a of the same shapes in the process of carriage. Due to the guide spaces 30a, the lead frame 1 can slide in the carriage direction Y along the lower guide rails 301a and 301b and the upper fixed guide rails 315a and 315b while maintaining the prescribed position along the shorter-side direction X.

The lower guide rails 301a and 301b, the upper guide rails 310a and 310b and the upper fixed guide rails 315a and 315b support the end portions 1d of the lead frame 1 in the aforementioned manner. Thus, it is possible to support the lead frame 1 which is provided with the semiconductor device 1a in a portion close to its center.

The base 200 is provided on its upper surface with a pair of rail drive devices 316a and 316b, which drive the lower guide rails 301a and 301b to move the same along the shorter-side direction X.

<Structure of Width Adjusting Device 400>

Figure 5:
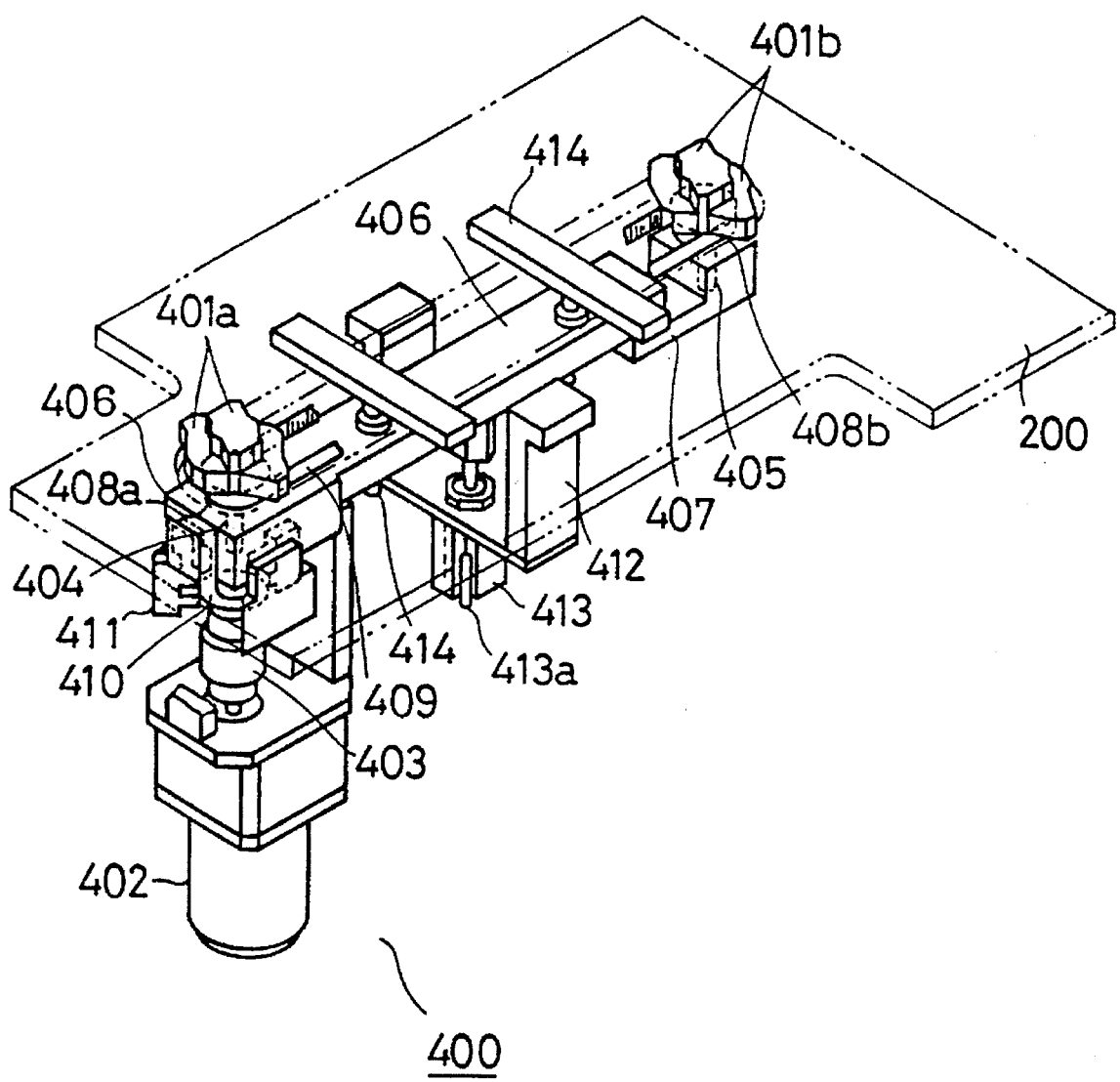
FIG. 5 is a perspective view showing a width adjusting device in the embodiment of the present invention.

FIG. 5 is a perspective view showing the width adjusting device 400. The structure of this width adjusting device 400 is now described with reference to FIGS. 1, 2 and 5. The width adjusting device 400 is adapted to adjust the width of the guide rail 300, i.e., the space between the pair of opposite lower guide rails 301a and 301b in response to the width (first width) of the lead frame 1 along the shorter-side direction X. The width of the guide rail 300 corresponds to the position for supporting the lead frame 1.

The width adjusting device 400 comprises cams (polyhedral blocks) 401a and 401b. Each of the cams 401a and 401b is formed by fixedly superposing two types of columns having bottom surfaces defined by two-dimensional figures which are point-symmetrical about symmetry axes in two stages so that the symmetry axes are matched with each other. Each column has a plurality of diameters which are varied with directions.

The width adjusting device 400 further comprises a motor 402, rotation of which is transmitted to the cam 401a through a coupling 403 and a drive shaft 404. The drive shaft 404 is fixedly mounted on the cam 401a along the symmetry axis of the cam 401a. On the other hand, a driven shaft 405 is fixedly mounted on the cam 401b along the symmetry axis thereof. The drive shaft 404 is rotatably and vertically fixedly supported by a holder 406, thereby maintaining the cam 401a in a constant position along the vertical direction. Similarly, the driven shaft 405 is rotatably and vertically fixedly supported by another holder 407, thereby maintaining the cam 401b in a constant position along the vertical direction. Pulleys 408a and 408b are fixedly mounted on the drive shaft 404 and the driven shaft 405 respectively, and a transmission belt 409 is extended along the pulleys 408a and 408b. The rotation of the motor 402 is also transmitted to the cam 401b successively through the drive shaft 404, the pulleys 408a, the transmission belt 409, the pulley 408b and the driven shaft 405, whereby the two cams 401a and 401b are synchronously rotated while keeping the same rotational position.

It is possible to vary the interspace between the pair of lower guide rails 301a and 301b holding the cams 401a and 401b therebetween, by changing the rotational and vertical positions of the cams 401a and 401b.

A discoidal detector 410 having marks on portions close to its outer edge is fixedly mounted on the drive shaft 404, while a rotation detector 411 such as a rotary encoder is provided on the holder 406. The rotation detector 411 reads the marks provided on the detector 410, thereby detecting the positions of the cams 401a and 401b along the rotational directions.

A block 412 mounted on the bottom surface of the base 200 is provided with a drive unit 413 for vertically driving the holder 406 and a position detector 413a for detecting the vertical position of the holder 406. The position detector 413a is formed by a reed switch, for example. The vertical movement of the holder 406 is guided by two guiders 414, which are fixedly mounted on the bottom surface of the base 200 for slidably supporting the holder 406.

<Structure of Stop Device 500>

Figure 6:
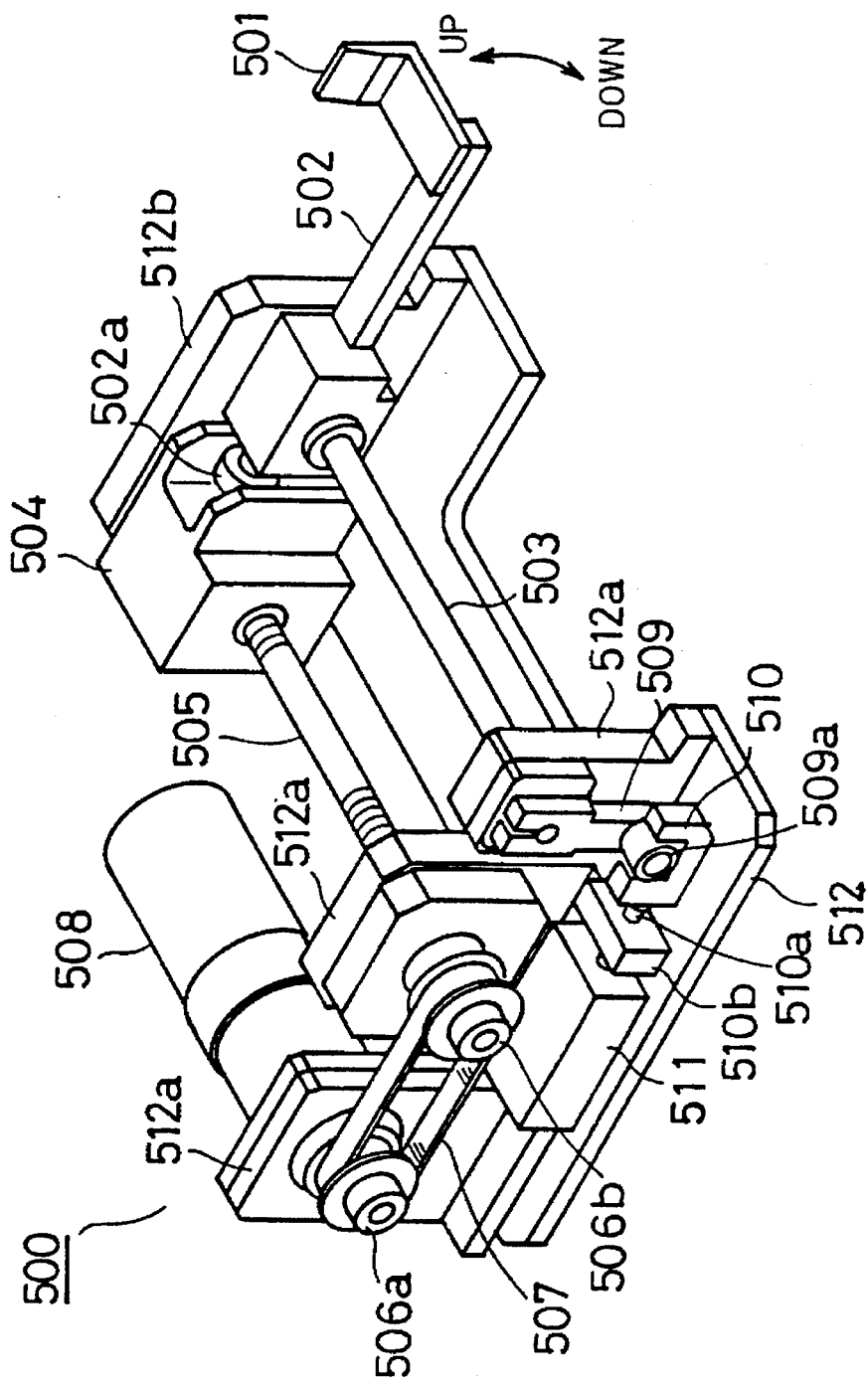
FIG. 6 is a perspective view showing a stop device in the embodiment of the present invention.

FIG. 6 is a perspective view of the stop device 500. The structure of this stop device 500 is now described with reference to FIGS. 1 and 6. The stop device 500 is adapted to stop the lead frame 1 at a prescribed position along the carriage direction Y in response to a longitudinal width (second width) of the lead frame 1.

The stop device 500 comprises a stopper 501, which is brought into contact with the edge of the lead frame 1 along the carriage direction Y for stopping the lead frame 1. This stopper 501 is fixedly mounted on an end of a mounting arm 502, while a roller 502a is rotatably mounted on another end of the mounting arm 502. A guide rod 503 supports the mounting arm 502 slidably along the carriage direction Y and an opposite direction Ya, while fixedly supporting the same in a rotational direction about an axis of a shaft 503. Namely, the mounting arm 502 is integrally rotated with the shaft 503 following its rotation, while freely sliding along the axis of the shaft 503. The stopper 501 is upwardly or downwardly moved following such rotation of the mounting arm 502.

A movable block 504 having a groove for receiving the roller 502 with a small clearance is fitted with and supported by a screw shaft 505 having a male screw, to be moved in the carriage direction Y or the opposite direction Ya following rotation of the screw shaft 505. Upon such movement of the movable block 504, the mounting arm 502 is guided by the shaft 503 for similar movement. Due to the small clearance defined between the roller 502a and the movable block 504, the roller 502a rolls on the groove surface of the movable block 504 upon rotation of the mounting arm 502, whereby the rotation of the mounting arm 502 is not hindered by the movable block 504. Rotation of a motor 508 is transmitted to the screw shaft 505 through pulleys 506a and 506b and a transmission belt 507.

An arm 509 is fixedly provided on an end of the shaft 503, while a roller 509a is rotatably mounted on the forward end of the arm 509. A transmission block 510 having a groove for receiving the roller 509a with a small clearance is connected to a drive unit 511 through a rod 510a, to be moved in the shorter-side direction X by action of the drive unit 511. The rod 510a is slidably supported by a guide block 510b which guides the movement of the transmission block 510 in the shorter-side direction X.

A substrate 512, which is a support for the overall stop device 500, is fixedly provided on the upper surface of the base 200. The substrate 512 is vertically fixedly provided with plate type support plates 512a and 512b, which rotatably support the shaft 503 and the screw shaft 505. The motor 508 is fixedly provided on the support plate 512a. The drive unit 511 and the guide block 510b are fixedly supported by the upper surface of the substrate 512.

<Structure of Carrier Device 600>

Figure 7:
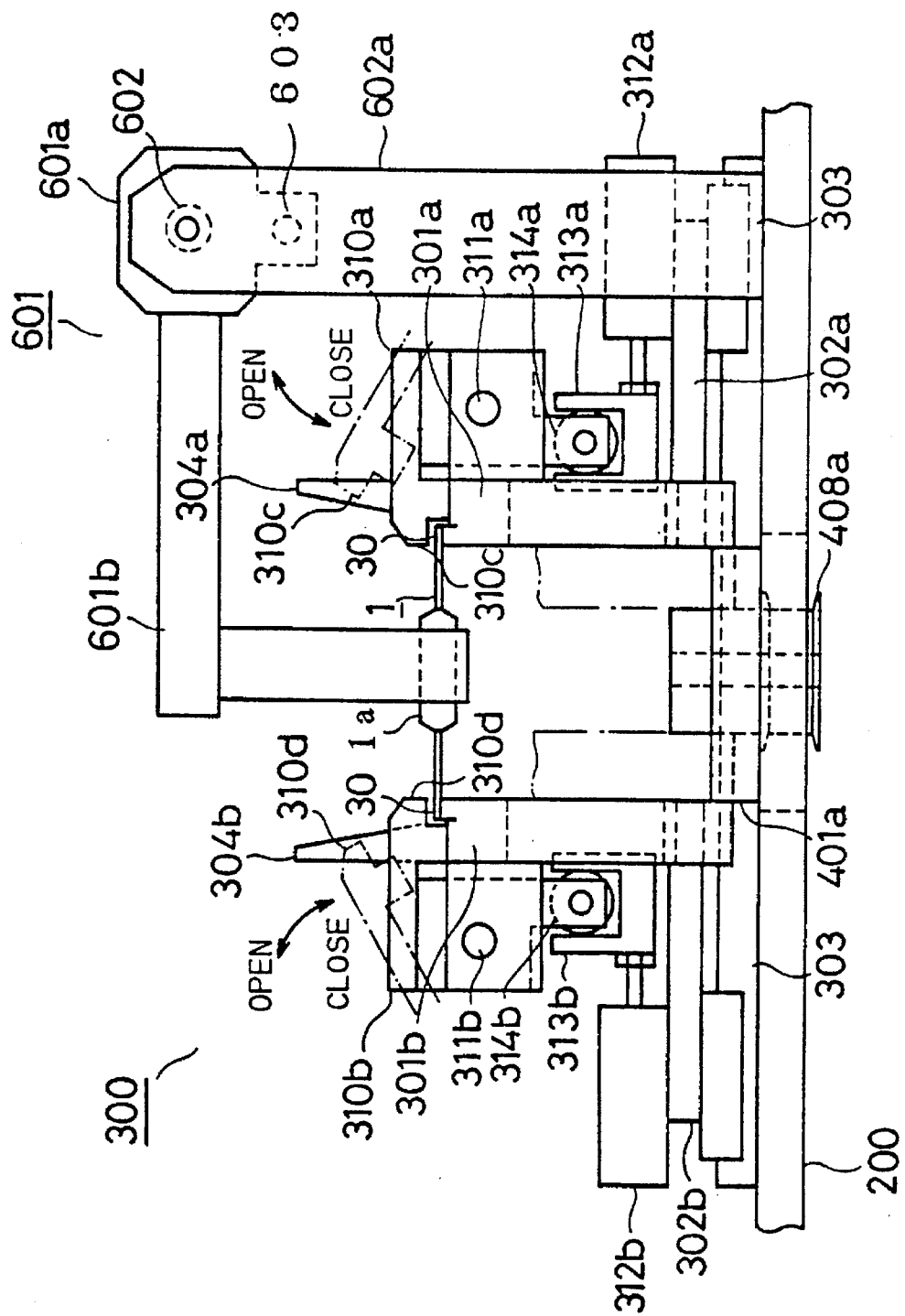
FIG. 7 is a partial front elevational view showing the apparatus for carrying and locating a sheet frame according to the embodiment of the present invention.

FIG. 7 is a partial front elevational view of the apparatus 100. The structure of the carrier device 600 is now described with reference to FIGS. 1 and 7. The carrier device 600 is adapted to carry the lead frame 1, which is held in the guide spaces 30 and 30a of the guide rail 300, in the carriage direction Y with a prescribed distance corresponding to the longitudinal width of the lead frame 1.

The carrier device 600 comprises a carrier 601 for urging the lead frame 1 in the carriage direction Y. This carrier 601 has a movable block 601a which is fitted with a screw shaft 602 having a male screw, and an arm 601b which is fixedly connected to the movable block 601a so that its forward end portion comes into contact with the lead frame 1 to press the same. The screw shaft 602 is rotatably supported by support plates 602a and 602b which are uprightly provided on the base 200. A guide shaft 603 is extended across the support plates 602a and 602b in parallel with the screw shaft 602, to slidably support the movable block 601a. Upon rotation of the screw shaft 602, therefore, the carrier 601 is translated in the carriage direction Y or the opposite direction Ya while keeping a constant condition with no rotation. A driven pulley 604a is mounted on an end of the screw shaft 602, so that rotation of a carriage drive motor 605 provided on the base 200 is transmitted to the screw shaft 602 through a drive pulley 604b, a belt 606 and the driven pulley 604a.

FIG. 1 illustrates the screw shaft 602 and the guide shaft 603 in a partially fragmented manner, for the convenience of illustration.

<Operation of Apparatus 100 and System 800>

The apparatus 100 and the system 800 operate along the following steps: The control unit 700 (FIG. 1), which is formed by a circuit containing a microcomputer and a storage circuit, stores information as to the objects of production (production information) including information as to widths of the lead frame 1 along the longitudinal and shorter-side directions.

<First Step>

First, the control unit 700 transmits prescribed signals to the rail drive devices 316a and 316b. On the basis of these signals, the rail drive devices 316a and 316b move the pair of lower guide rails 301a and 301b to separate the same from each other, thereby sufficiently broadening the interspace therebetween.

<Second Step>

Then, the control unit 700 by way of a control means 700a calculates a space between the pair of upper guide rails 310a and 310b corresponding to the width of the lead frame 1 along the shorter-side direction X, and transmits a control signal corresponding to the as-calculated value to the motor 402 and the drive unit 413. In response to the signal, the motor 402 and the drive unit 413 operate to set vertical and rotational positions of the cams 401a and 401b. The rotation detector 411 and the position detector 413a detect whether or not the cams 401a and 401b are set at prescribed positions, and feed back detection signals to the control unit 700. The control unit 700 transmits control signals to the motor 402 and the drive unit 413 so that the detection signals are matched with signals corresponding to the prescribed positions.

<Third Step>

Then, the control unit 700 transmits prescribed control signals to the rail drive devices 316a and 316b. The rail drive devices 316a and 316b responsively operate to approach the pair of lower guide rails 301a and 301b to each other, for pressing opposite vertical surfaces thereof against outer peripheral surfaces of the cams 401a and 401b.

Figure 8:
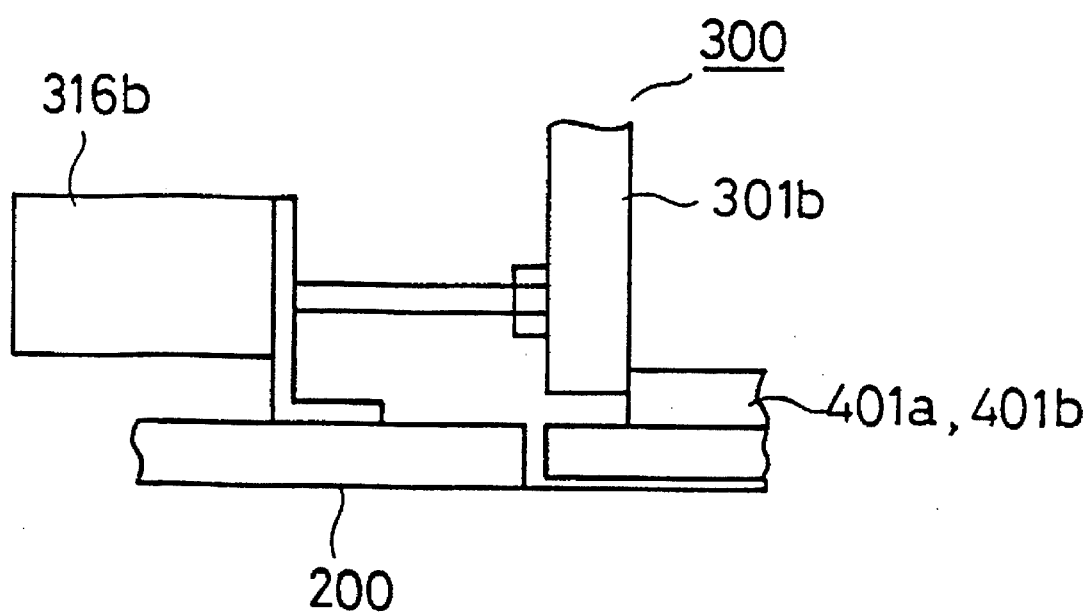
FIG. 8 is a partial front elevational view showing the guide rail in the embodiment of the present invention.

Thus, the interspace between the pair of lower guide rails 301a and 301b is set at a value corresponding to the width of the lead frame 1 along the shorter-side direction X. FIG. 8 is a partial front elevational view showing the guide rail 300, for typically illustrating the lower guide rail 301b whose vertical surface is pressed against the upper peripheral surface of upper stages of the cams 401a and 401b, for example.

<Fourth Step>

Then, the control unit 700 by way of a control means 700b calculates a carriage distance on the basis of the information as to the longitudinal width of the lead frame 1, and further calculates a stop position by way of a control means 700c of the lead frame 1 corresponding thereto, and transmits a control signal corresponding to the as-calculated stop position to the motor 508 (FIG. 1). In response to this control signal, the motor 508 is rotated in a prescribed direction by a prescribed amount. Following this rotation, the movable block 504 (FIG. 6) is moved by a prescribed distance, to set the stopper 501 at the stop position. The stopper 501 is vertically maintained at an upper position.

<Fifth Step>

Then, the control unit 700 (FIG. 1) transmits prescribed signals to the drive units 312a and 312b. On the basis of these control signals, the drive units 312a and 312b urge the transmitters 313a and 313b. As the result, the upper guide rails 310a and 310b are rotated about the rotation supporting points 311a and 311b, to enter open states.

<Sixth Step>

When the apparatus 100 is in this state, a supply unit SP (FIG. 2) such as a robot, which is prepared in the exterior of the apparatus 100, is employed to drop the lead frame 1 from above the lower guide rails 301a and 301b in a substantially horizontal condition, thereby mounting the same on the upper surfaces of the lower guide rails 301a and 301b. During the process of such dropping, the lead frame 1 is guided by the inclined projection 304a and 304b to be mounted on a prescribed position on the upper surfaces of the lower guide rails 301a and 301b.

<Seventh Step>

Then, the control unit 700 transmits prescribed signals to the drive units 312a and 312b, which in turn draw the transmitters 313a and 313b in response to the control signals. Consequently, the upper guide rails 310a and 310b are rotated about the rotation supporting points 311a and 311b, to enter closed states. Thus, the lead frame 1 is held at a prescribed position along the shorter-side direction X, while being slidable along the lower guide rails 301a and 301b and the upper guide rails 310a and 310b.

<Eighth Step>

Then, the control unit 700 (FIG. 1) transmits a control signal corresponding to the previously calculated carriage distance to the carriage drive motor 605, which is responsively rotated in a prescribed direction by a prescribed amount. Following such rotation, the carrier 601 is moved in the carriage direction Y by a prescribed distance. At this time, the lead frame 1 is guided by the adjacent guide spaces 30 and urged by the forward end portion of the arm 601b, to be carried in the carriage direction Y by a prescribed distance. Such carriage is ended at a position where the edge surface of the lead frame 1 along the carriage direction Y is substantially in contact with the stopper 501. At this time, the both ends 1d of the lead frame 1 along the shorter-side direction X are separated from the guide spaces 30 and stored in the adjacent guide spaces 30a. In this state, the lead frame 1 is constrained by the upper fixed guide rails 315a and 315b in the shorter-side direction X with a prescribed clearance, by the lower guide rails 301a and 301b and the upper fixed guide rails 315a and 315b in the vertical direction with a prescribed clearance, and by the stopper 501 and the carrier 601 in the longitudinal direction. Thus, the lead frame 1 is held in a state being located at a prescribed position.

Figure 9:
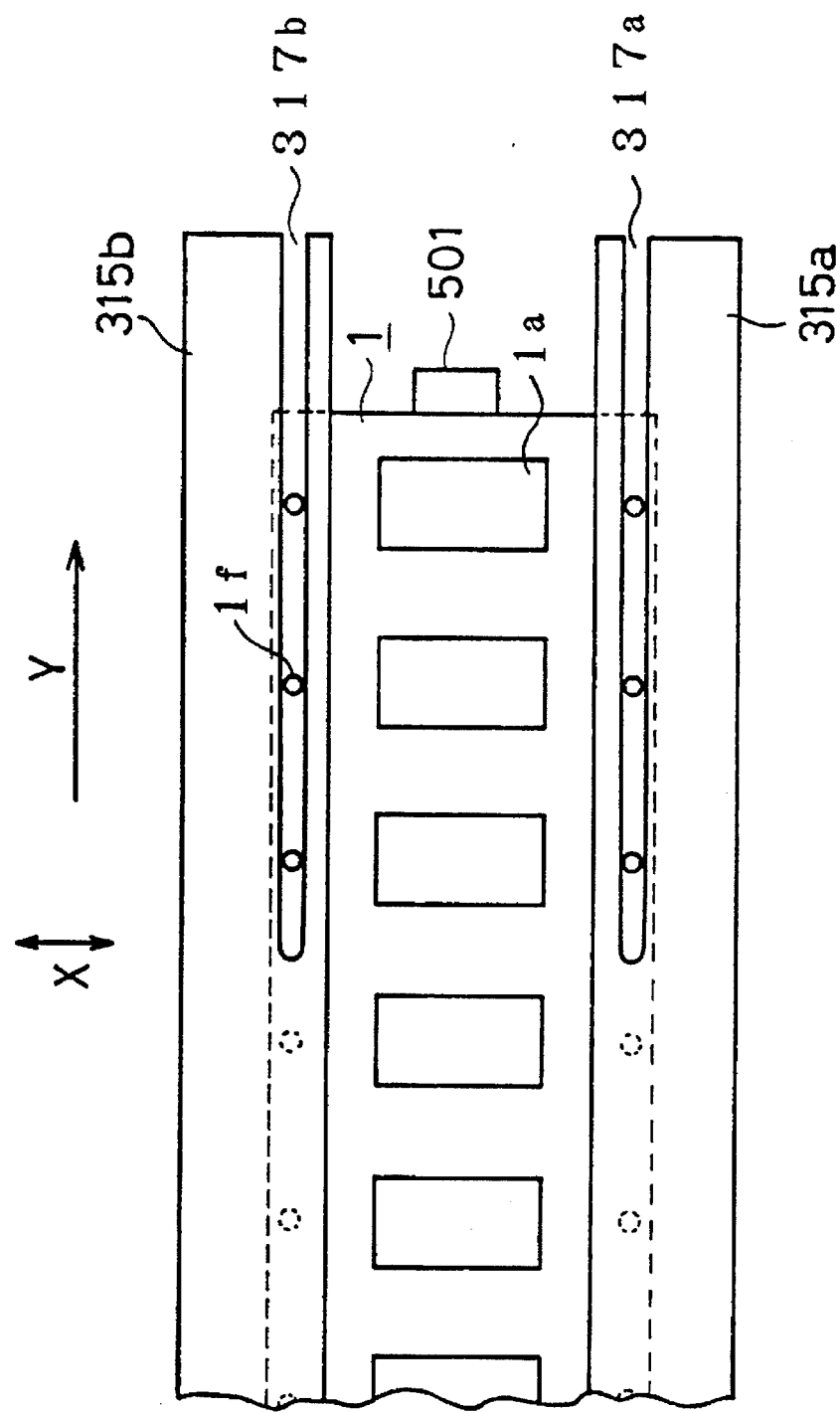
FIG. 9 is a partial plan view showing a lead frame and the upper fixed guide rails in the embodiment of the present invention.

FIG. 9 is a partial plan view showing the lead frame 1 being in this state and the upper fixed guide rails 315a and 315b supporting the same. The upper fixed guide rails 315a and 315b are provided with slits 317a and 317b having certain lengths from ends in the carriage direction Y. Holes 1f are provided at prescribed intervals in the vicinity of both edges of the lead frame 1 along the shorter-side direction X. These holes 1f are partially exposed from the upper fixed guide rails 315a and 315b in the vicinity of end portions of the lead frame 1 along the carriage direction Y.

<Ninth Step>

Then, a transfer device (not shown) provided in an apparatus for carrying out a step of forming the lead frame 1 is moved to a prescribed position, so that projections (not shown) provided in the transfer device engage with the exposed holes 1f.

<Tenth Step>

Thereafter the control unit 700 (FIG. 1) transmits a prescribed control signal to the drive unit 511 (FIG. 6), which in turn is rotated in a prescribed direction in response to the control signal, whereby the stopper 501 is downwardly moved to release the lead frame 1 from the stopped state. Then the aforementioned transfer device is moved in the carriage direction Y, so that the lead frame 1 is separated from the guide rail 300 and transferred to the following forming step.

<Eleventh Step>

When the lead frame 1 is carried to the exterior of the guide rail 300, the control unit 700 transmits a prescribed control signal to the drive unit 511. The drive unit 511 is rotated in a prescribed direction in response to the control signal, whereby the stopper 501 is upwardly moved to return to a position capable of stopping a new lead frame 1.

<Twelfth Step>

Then, the control unit 700 transmits a prescribed control signal to the carriage drive motor 605 (FIG. 1 and FIG. 7), which in turn is rotated in a prescribed direction by a prescribed amount in response to the control signal. Thus, the carrier 601 returns to the prescribed position in advance of the next carriage.

<Thirteenth Step>

When a subsequently supplied lead frame 1 is of the same type as the lead frame 1 which has been carried and located, the aforementioned fourth to twelfth steps are repeated. If the subsequently supplied lead frame 1 is different from the preceding lead frame 1, on the other hand, the first to twelfth steps are repeated.

<Advantages of Apparatus 100 and System 800>

In the apparatus 100 and the system 800 according to this preferred embodiment, the interspace between the pair of lower guide rails 301a and 301b is variable, whereby it is possible to handle various lead frames having different widths in shorter-side directions. Further, the position of the stopper 501 and the distance of carriage by the carrier 601 are variable, whereby it is possible to handle various lead frames 1 having different widths in longitudinal directions. When the apparatus according to this preferred embodiment is employed, it is possible to handle various lead frames 1 having dimensions which are generally different in shorter-side and longitudinal directions.

Further, the guide rail 300 has a mechanism for opening and closing the upper guide rails 310a and 310b, which are approached to each other along a direction substantially perpendicular to the surface of the lead frame 1 for suppressing the end portions 1d thereof. Even if the lead frame 1 is so deformed that the same cannot be stored in the guide spaces 30, therefore, it is possible to store the end portions 1d of the lead frame 1 in the guide spaces 30 without damaging the same.

<Preferred Embodiment 2>

Figure 10:
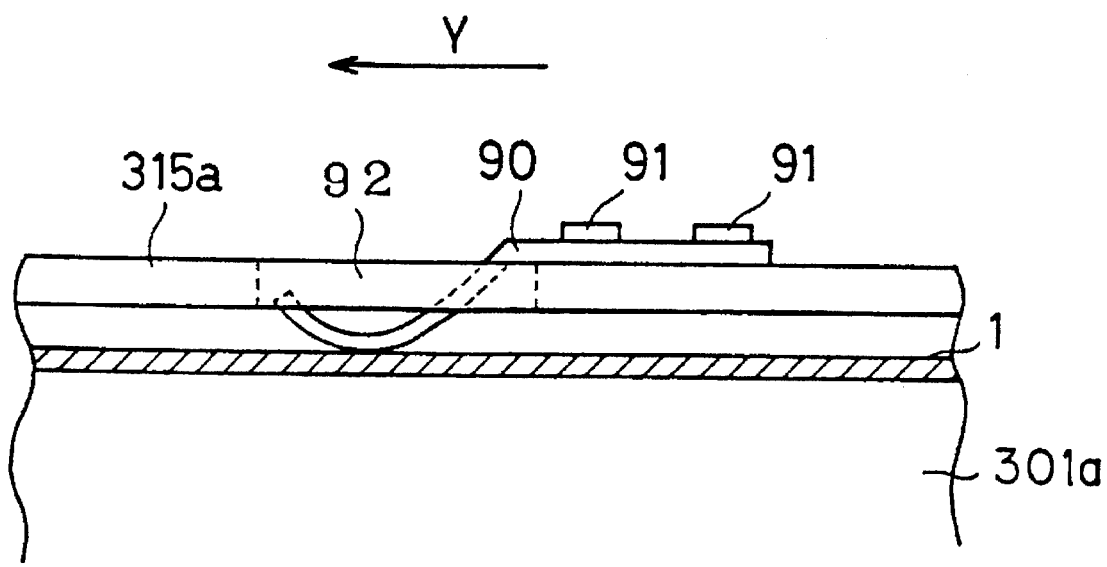
FIG. 10 is a partial side sectional view showing an apparatus for carrying and locating a sheet frame according to a second embodiment of the present invention.
Figure 11:
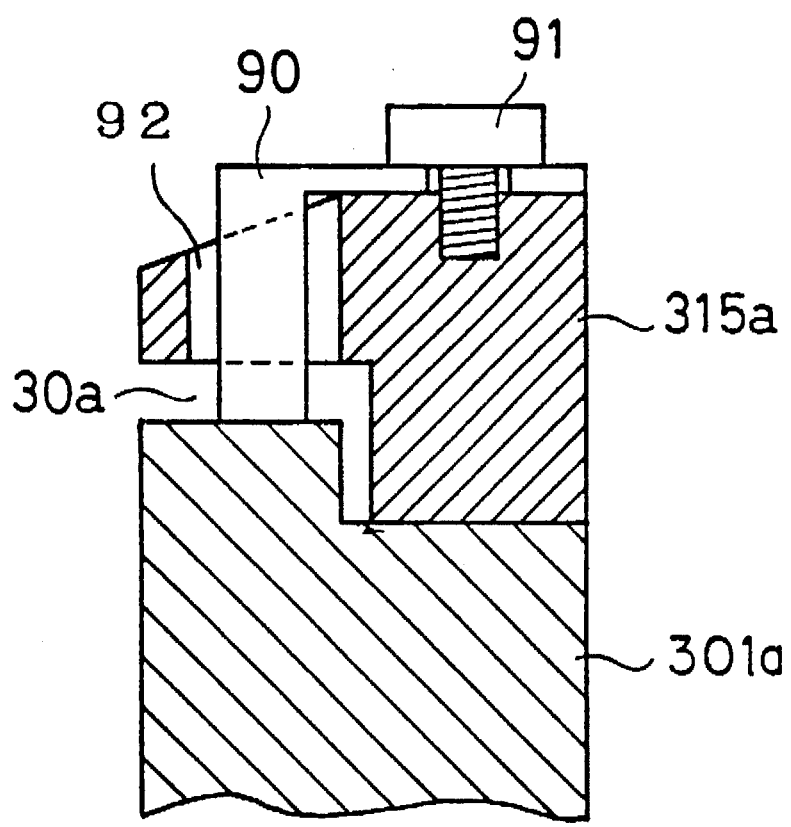
FIG. 11 is a partial front sectional view showing the apparatus for carrying and locating a sheet frame according to the second embodiment of the present invention.

The upper fixed guide rails 315a and 315b maybe provided with pressers for pressing the lead frame 1 with proper pressures. FIG. 10 is a partial side sectional view showing an apparatus according to a second preferred embodiment of the present invention, and FIG. 11 is a partial front sectional view showing the same. Pressers 90 are mounted on upper fixed guide rails 315a and 315b by screws 91. Such pressers 90 are obtained by bending plates of phosphor bronze, for example, having excellent elasticity. The upper fixed guide rails 315a and 315b are provided with holes 92, so that the pressers 90 pass through the holes 92 to be in contact with the upper surfaces of the lower guide rails 301a and 301b while applying pressures of suitable strength. When a lead frame 1 is carried under the upper fixed guide rails 315a and 315b, therefore, the lead frame 1 is located under the pressers 90 (FIG. 10). Consequently, the pressers 90 apply proper pressures to the lead frame 1 to cause proper frictional force, thereby holding the lead frame 1 in a stable position even if constraining means such as a carrier 601 is released.

In the apparatus according to the second preferred embodiment, therefore, it is possible to carry out the twelfth step immediately after completion of the aforementioned eighth step. Thus, it is possible to carry out the twelfth step to the seventh step after repetition simultaneously with the ninth to eleventh steps in a parallel manner. In the apparatus according to this preferred embodiment, therefore, it is possible to execute the processing with higher working efficiency as compared with the prior art.

<Preferred Embodiment 3>

Figure 12:
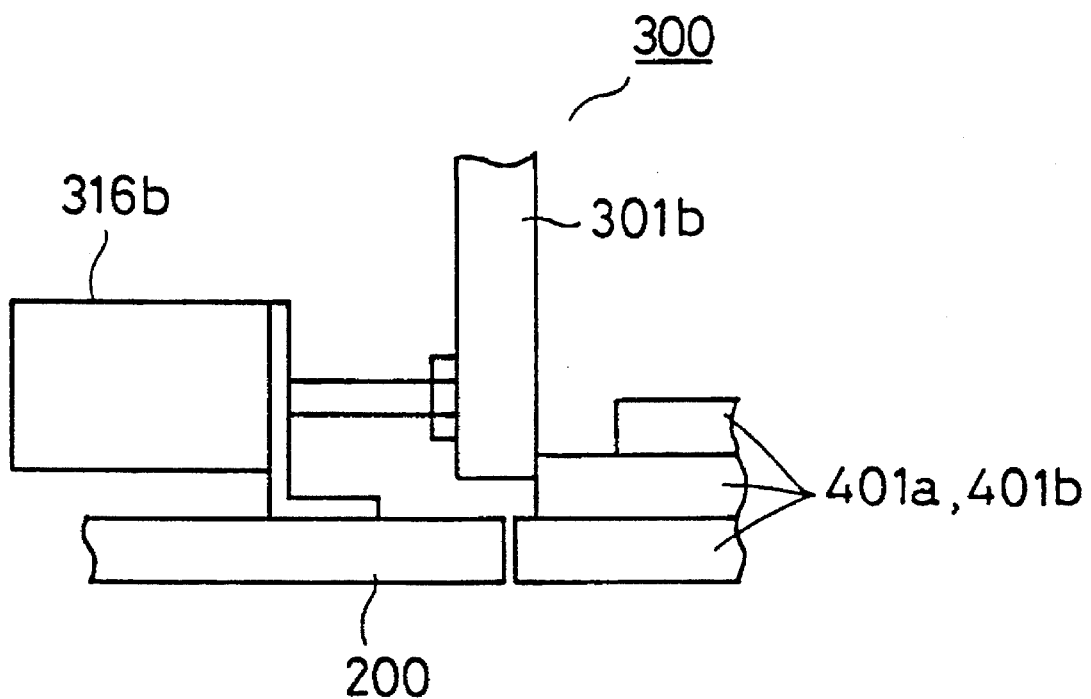
FIG. 12 is a partial front sectional view showing a guide rail in a third embodiment of the present invention.
Figure 13:
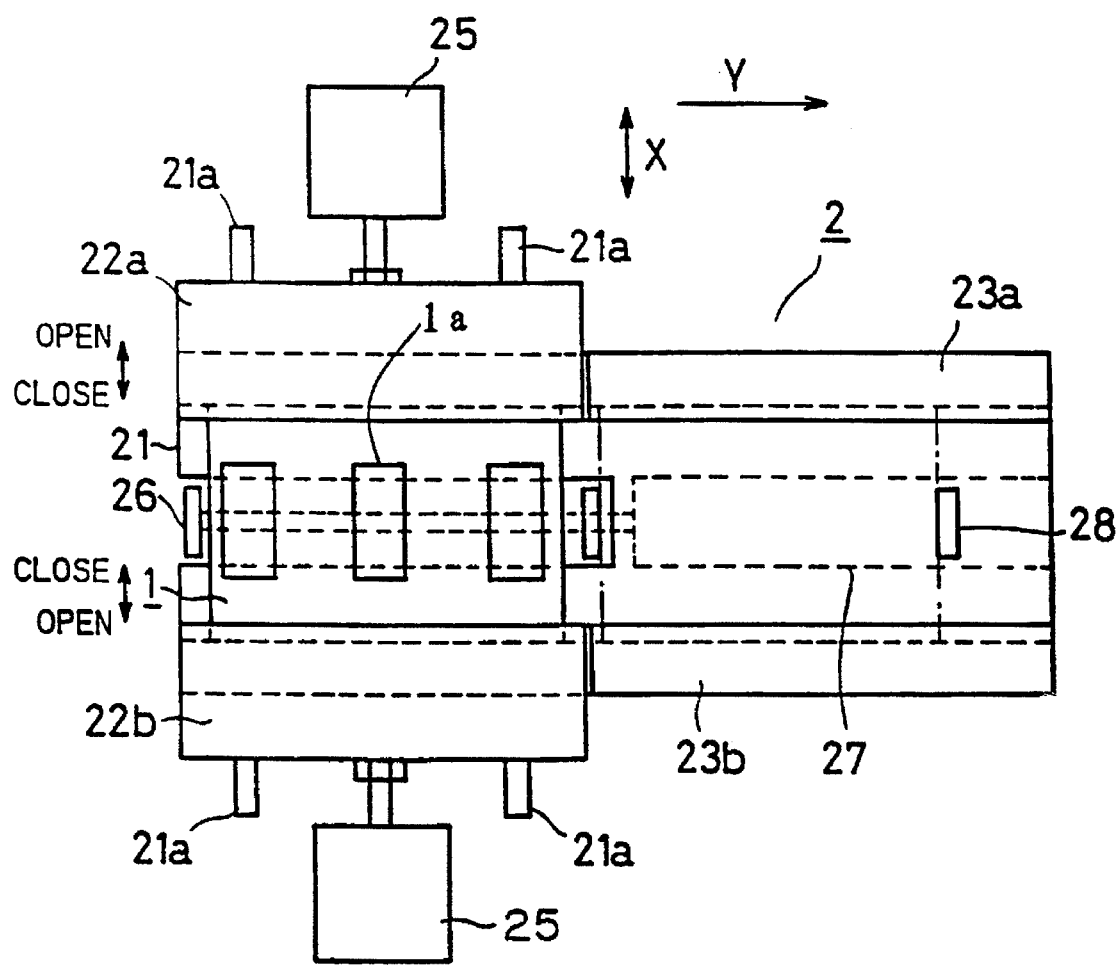
FIG. 13 is a plan view showing a conventional apparatus for carrying and locating a sheet frame.
Figure 14:
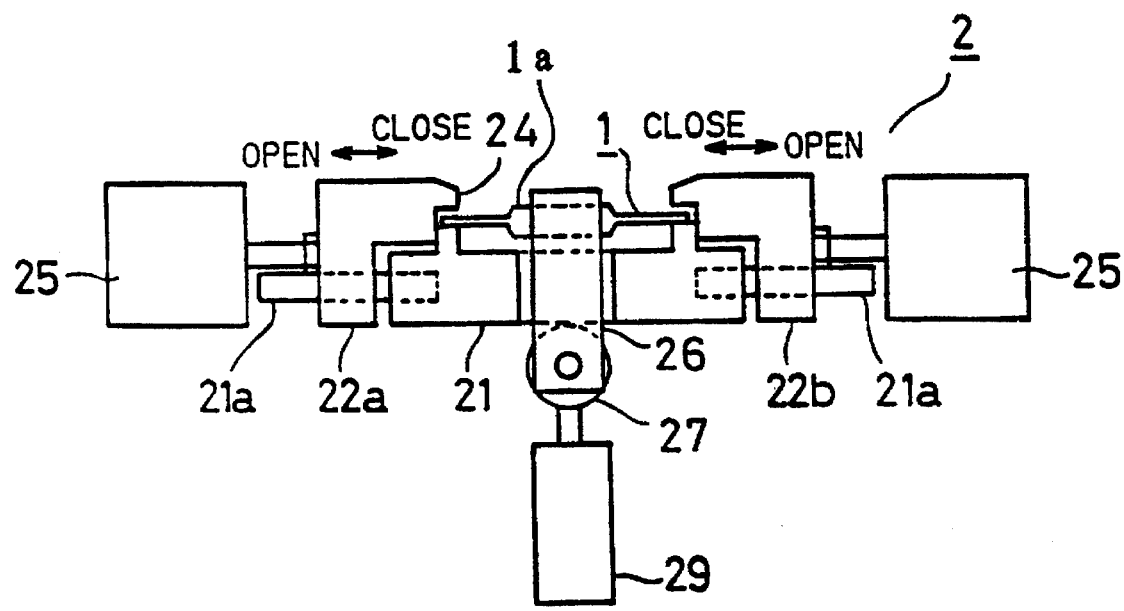
FIG. 14 is a front elevational view of the conventional apparatus for carrying and locating a sheet frame.

The cams 401a and 401b, which are obtained by stacking polyhedrons in two stages as shown in FIG. 5, may be replaced by those of a single-stage structure, or each of such cams may be obtained by stacking polyhedrons in three or more stages, as illustrated in FIG. 12 showing a partial front elevational view of a guide rail 300. The structure of the cams may be selected from the above in response to necessity in manufacturing steps.

<Preferred Embodiment 4>

In the apparatus according to the aforementioned first preferred embodiment, the upper guide rails 310a and 310b are rotated about the rotation supporting points 311a and 311b. However, the upper guide rails 310a and 310b may be in other structure, so far as the same are downwardly moved from portions substantially vertically above the lead frame 1 to hold the edges of the lead frame 1. For example, the upper guide rails 310a and 310b may be approached to the edges of the lead frame 1 from vertical directions or oblique directions close to the vertical directions. Also in this structure, it is possible to store the edges of the lead frame 1 in the guide spaces 30 without damaging the same even if the lead frame 1 is so deformed that the same cannot be stored in the guide spaces 30, similarly to the first preferred embodiment.

While the invention has been shown and described in detail, the foregoing description is in all aspects illustrative and not restrictive. It is therefore understood that numerous modifications and variations can be devised without departing from the scope of the invention.

We claim:

1. A method of carrying and locating a sheet frame for carrying a sheet frame, which is substantially in the form of a flat plate, along a direction of a first axis in a major surface of said sheet frame by a prescribed distance, and holding the sheet frame at a prescribed position, said method of carrying and locating a sheet frame comprising:

(a) a guiding step which comprises supporting said sheet frame in a manner to permit the supported sheet frame to be slidable along said direction of said first axis;
   (b) a width adjusting step which comprises adjusting a supporting position for supporting said sheet frame in said guiding step (a) in a direction of a second axis, which is perpendicular to said first axis, in said major surface in correspondence to a first width of said sheet frame in said direction of said second axis;
   (c) a carrying step which comprises carrying said supported sheet frame in said direction of said first axis by a prescribed distance in correspondence to a second width of said sheet frame in said direction of said first axis; and
   (d) a stopping step which comprises stopping said supported sheet frame at a prescribed position in correspondence to said second width;

wherein:

said guiding step (a) comprises:
   (a-1) a step of guiding a first major surface of said sheet frame at an end portion of said sheet frame or in a vicinity of said end portion in said direction of said first axis;
   (a-2) a step of guiding a second major surface of said sheet frame at said end portion or in a vicinity of said end portion in said direction of said first axis; and
   (a-3) a step of guiding an edge surface of said sheet frame at said end portion in said direction of said first axis, wherein;

said guiding step (a-1) comprises:
   (a-1—1) a step of preparing first means for guiding said first major surface of said sheet frame at said end portion or in the vicinity of said end portion in said direction of said first axis;
   (a-1-2) a step of approaching said first means to said first major surface from a substantially opposite direction; and
   (a-1-3) a step of guiding said first major surface of said sheet frame in said direction of said first axis through said first means.

2. A method of carrying and locating a sheet frame in accordance with claim 1, wherein;

said guiding step (a-1) further comprises:
   (a-1-4) a step of preparing second means provided adjacently to said first means in said direction of said first axis for guiding said first major surface of said sheet frame at said end portion or in the vicinity of said end portion in said direction of said first axis; and
   (a-1-5) a step of, after said step (a-1-3), guiding said first major surface of said sheet frame in said direction of said first axis through said second means.

3. A method of carrying and locating a sheet frame in accordance with claim 2, wherein:

said guiding step (a) further comprises:
   (a-4) a step of guiding said sheet frame to a position for carrying out said guiding step (a-2) in advance of said guiding step (a-1).

4. A method of carrying and locating a sheet frame in accordance with claim 1, further comprising a controlling step (e) including:

(e-1) a step of calculating said position for supporting said sheet frame in said guiding step (a) on a basis of said first width of said sheet frame and transmitting a first signal corresponding to the result;
   (e-2) a step of calculating a distance for carrying said sheet frame in said direction of said first axis on a basis of said second width of said sheet frame and transmitting a second signal corresponding to the result; and (e-3) a step of calculating a position for stopping said sheet frame on the basis of said second width of said sheet frame and transmitting a third signal corresponding to the result wherein:

said width adjusting step (b) comprises:

(b-1) a step of adjusting said position for supporting said sheet frame in said guiding step (a) in said direction of said second axis in response to said first signal;

said carrying step (c) comprises:

(c-1) a step of carrying said sheet frame in said direction of said first axis by a prescribed distance in response to said second signal; and said stopping step (d) comprises:

(d-1) a step of stopping said sheet frame at a prescribed position in response to said third signal.

* * * * *